US012044761B2

(12) United States Patent
Liu et al.

(10) Patent No.: US 12,044,761 B2
(45) Date of Patent: Jul. 23, 2024

(54) MAGNETIC RESONANCE IMAGING SYSTEM AND TRANSMISSION APPARATUS AND TRANSMISSION METHOD

(71) Applicant: GE Precision Healthcare LLC, Wauwatosa, WI (US)

(72) Inventors: Yu Liu, Beijing (CN); Tingting Song, Beijing (CN); Kai Wang, Beijing (CN); Haoyang Xing, Beijing (CN); Jianye Ning, Beijing (CN); Xin Xie, Beijing (CN); Dongliang Yang, Beijing (CN); Chunlai Xiao, Beijing (CN)

(73) Assignee: GE Precision Healthcare LLC, Wauwatosa, WI (US)

( * ) Notice: Subject to any disclaimer, the term of this patent is extended or adjusted under 35 U.S.C. 154(b) by 75 days.

(21) Appl. No.: 17/898,251

(22) Filed: Aug. 29, 2022

(65) Prior Publication Data
US 2023/0075638 A1    Mar. 9, 2023

(30) Foreign Application Priority Data

Sep. 8, 2021   (CN) .......................... 202111049631.9

(51) Int. Cl.
*G01V 3/00* (2006.01)
*G01R 33/54* (2006.01)

(52) U.S. Cl.
CPC .................. *G01R 33/543* (2013.01)

(58) Field of Classification Search
CPC ............. G01R 33/3415; G01R 33/543; G01R 33/5659; G01R 33/36; A61B 5/055
USPC ......................................................... 324/309
See application file for complete search history.

(56) References Cited

U.S. PATENT DOCUMENTS

| 6,504,428 B2 | 1/2003 | Cova |
| 8,368,470 B2 | 2/2013 | Alidio |
| 2018/0164392 A1* | 6/2018 | George ................. A61B 5/055 |
| 2018/0242334 A1* | 8/2018 | Kim .................... H04W 72/542 |

FOREIGN PATENT DOCUMENTS

| CN | 1806050 A | * | 7/2006 | .......... C12N 15/101 |
| CN | 104348423 B | | 6/2021 | |

* cited by examiner

*Primary Examiner* — Walter L Lindsay, Jr.
*Assistant Examiner* — Frederick Wenderoth

(57) ABSTRACT

Provided in an embodiment of the present application are a magnetic resonance imaging system and a transmission apparatus and a transmission method. The method comprises: generating and outputting a pulse signal by a transmission controller; amplifying the pulse signal by a radio-frequency amplifier; transmitting, by a signal processor, the signal amplified by the radio-frequency amplifier to a transmit coil of the magnetic resonance imaging system; and generating frequency offset lookup information for bandwidth compensation of the entire transmission apparatus according to bandwidth data of the transmission controller, the radio-frequency amplifier, and the signal processor; wherein the frequency offset lookup information is used to control the transmission controller to generate output power. Thus, the method can use the frequency offset lookup information to perform digital pre-distortion processing of a power amplifier, and can also improve the bandwidth performance of the entire transmission apparatus and improve the quality of magnetic resonance images.

19 Claims, 4 Drawing Sheets

MAGNETIC RESONANCE IMAGING SYSTEM AND TRANSMISSION APPARATUS AND TRANSMISSION METHOD

CROSS REFERENCE

The present application claims priority and benefit of Chinese Patent Application No. 202111049631.9 filed on Sep. 8, 2021, which is incorporated herein by reference in its entirety.

TECHNICAL FIELD

Embodiments of the present application relate to the technical field of medical devices, and relate in particular to a magnetic resonance imaging system and a transmission apparatus and a transmission method.

BACKGROUND

Magnetic resonance imaging (MRI) systems have been widely applied in the field of medical diagnosis. A magnetic resonance imaging system typically has a main magnet, a gradient radio-frequency amplifier, a gradient coil, a transmit chain module, a transmit/receive coil, a receive chain module, etc. The transmit chain module generates a pulse signal and transmits the same to the transmit/receive coil. The transmit/receive coil generates a radio-frequency excitation signal to excite a scan subject to generate a magnetic resonance signal. After the excitation, the transmit/receive coil receives the magnetic resonance signal, and a medical parameter image is reconstructed according to the magnetic resonance signal.

In a magnetic resonance transmit chain module, the forward power, reverse power, voltage standing wave ratio (VSWR), return loss, radio-frequency specific absorption rate (SAR), etc. are always important reference indicators of the transmit chain module. The voltage standing wave ratio can reflect a matching status of a radio-frequency load. The return loss indicates the ratio of a reflected power of a radio-frequency input signal to an input signal power, and can also reflect a matching status of a radio-frequency load. The SAR can indicate the rate at which a radio-frequency signal is absorbed by a scan subject.

SUMMARY

Currently, a transmission apparatus of a magnetic resonance imaging system may include a transmission controller, a radio-frequency amplifier, and a signal processor. However, the inventors have found that currently, bandwidth data of various components of the transmission apparatus is configured separately, and even if an indicator of bandwidth data of each component is good, e.g. +/−650 kHz (+/−0.25 dB), +/−500 kHz, etc., an indicator of bandwidth data of the entire transmission apparatus is still poor, e.g., only +/−250 kHz. This greatly affects the performance of the transmission apparatus and reduces the quality of magnetic resonance images.

In view of at least one of the above technical problems, embodiments of the present application provide a magnetic resonance imaging system and a transmission apparatus and a transmission method.

According to an aspect of the embodiments of the present application, provided is a transmission method of a magnetic resonance imaging system. The method includes generating and outputting a pulse signal by a transmission controller; amplifying the pulse signal by a radio-frequency amplifier; and transmitting, by a signal processor, the signal amplified by the radio-frequency amplifier to a transmit coil of the magnetic resonance imaging system. The method further includes generating frequency offset lookup information for bandwidth compensation of the entire transmission apparatus according to bandwidth data of the transmission controller, the radio-frequency amplifier, and the signal processor; wherein the frequency offset lookup information is used to control the transmission controller to generate output power.

In some embodiments, the bandwidth data of the transmission controller, the radio-frequency amplifier, and the signal processor is pre-generated respectively according to a standard load, and the bandwidth data of the transmission controller, the radio-frequency amplifier, and the signal processor is pre-stored respectively in respective memories.

In some embodiments, the method further includes obtaining the bandwidth data of the transmission controller, the radio-frequency amplifier, and the signal processor from the memories of the transmission controller, the radio-frequency amplifier, and the signal processor, respectively, when the transmission controller, the radio-frequency amplifier, and the signal processor are integrated and initialized.

In some embodiments, the method further comprises: generating, for a particular load in a pre-scanning stage, a plurality of training pulse signals modulated at different frequencies of a full bandwidth, and performing a first update on the frequency offset lookup information according to the plurality of training pulse signals.

In some embodiments, the method further includes generating output power for the particular load in a scanning stage by a direct digital frequency synthesizer in the transmission controller according to the frequency offset lookup information that has undergone the first update.

In some embodiments, the method further comprises performing a second update on the frequency offset lookup information according to a predetermined load or a load determined by machine learning.

In some embodiments, the method further comprises generating output power for a particular load in a scanning stage by the transmission controller according to the frequency offset lookup information that has undergone the second update.

In some embodiments, the method further comprises determining whether a particular load is the same as or similar to the predetermined load or the load determined by machine learning. If the two are the same or similar, generating output power for the particular load in a scanning stage by the transmission controller according to the frequency offset lookup information that has undergone the second update.

In some embodiments, if the two are not the same or similar, the method includes generating, for the particular load in a pre-scanning stage, a plurality of training pulse signals modulated at different frequencies of a full bandwidth, and performing a first update on the frequency offset lookup information according to the plurality of training pulse signals; and generating output power for the particular load in a scanning stage by the transmission controller according to the frequency offset lookup information that has undergone the first update.

According to another aspect of the embodiments of the present application, provided is a transmission apparatus of a magnetic resonance imaging system, the apparatus includes a transmission controller for generating and outputting a pulse signal; a radio-frequency amplifier for amplifying the pulse signal; a signal processor for transmitting the signal amplified by the radio-frequency amplifier to a transmit coil of the magnetic resonance imaging system. The apparatus further includes a bandwidth compensation unit for generating frequency offset lookup information for bandwidth compensation of the entire transmission apparatus according to bandwidth data of the transmission controller, the radio-frequency amplifier, and the signal processor; wherein the frequency offset lookup information is used to control the transmission controller to generate output power.

In some embodiments, the bandwidth data of the transmission controller, the radio-frequency amplifier, and the signal processor is pre-generated respectively according to a standard load, and the bandwidth data of the transmission controller, the radio-frequency amplifier, and the signal processor is pre-stored respectively in respective memories.

In some embodiments, the bandwidth compensation unit obtains the bandwidth data of the transmission controller, the radio-frequency amplifier, and the signal processor from the memories of the transmission controller, the radio-frequency amplifier, and the signal processor, respectively, when the transmission controller, the radio-frequency amplifier, and the signal processor are integrated and initialized.

In some embodiments, the transmission controller generates, for a particular load in a pre-scanning stage, a plurality of training pulse signals modulated at different frequencies of a full bandwidth, and the bandwidth compensation unit further performs a first update on the frequency offset lookup information according to the plurality of training pulse signals.

In some embodiments, the transmission controller generates output power for the particular load in a scanning stage according to the frequency offset lookup information that has undergone the first update.

In some embodiments, the bandwidth compensation unit further performs a second update on the frequency offset lookup information according to a predetermined load or a load determined by machine learning.

In some embodiments, the transmission controller generates output power for the particular load in a scanning stage according to the frequency offset lookup information that has undergone the second update.

In some embodiments, the transmission controller also determines whether a particular load is the same as or similar to the predetermined load or the load determined by machine learning. If the two are the same or similar, the transmission controller generates output power for the particular load in a scanning stage according to the frequency offset lookup information that has undergone the second update.

In some embodiments, if the two are not the same or similar, the transmission controller generates, for the particular load in a pre-scanning stage, a plurality of training pulse signals modulated at different frequencies of a full bandwidth, and the bandwidth compensation unit further performs a first update on the frequency offset lookup information according to the plurality of training pulse signals; and the transmission controller generates output power for the particular load in a scanning stage according to the frequency offset lookup information that has undergone the first update.

According to yet another aspect of the embodiments of the present application, provided is a magnetic resonance imaging system, comprising a transmit coil; and the transmission apparatus as previously described.

According to still another aspect of the embodiments of the present application, provided is a storage medium having a computer-readable program stored thereon, wherein the computer-readable program causes a computer to implement the method as previously described in a device.

One of the benefits of the embodiments of the present application is that: the frequency offset lookup information for bandwidth compensation of the entire transmission apparatus is generated according to bandwidth data of the transmission controller, the radio-frequency amplifier, and the signal processor. Thus, the method can use the frequency offset lookup information to perform digital pre-distortion processing of a power amplifier, and can also improve the bandwidth performance of the entire transmission apparatus and improve the quality of magnetic resonance images.

With reference to the following description and accompanying drawings, specific implementations of the embodiments of the present application are disclosed in detail, and manners in which the principle of the embodiments of the present application is employed are illustrated. It should be understood that the implementations of the present application are not thereby limited in scope. Within the spirit and scope of the appended claims, the implementations of the present application comprise various changes, modifications, and equivalents.

BRIEF DESCRIPTION OF THE DRAWINGS

The accompanying drawings are included to provide further understanding of embodiments of the present application, constitute a part of the specification, and are used to illustrate implementations of the present application and set forth the principles of the present application together with textual description. Obviously, the accompanying drawings in the following description are merely some embodiments of the present application, and a person of ordinary skill in the art could obtain other implementations according to the accompanying drawings without the exercise of inventive effort. In the accompanying drawings.

DETAILED DESCRIPTION

The foregoing and other features of the embodiments of the present application will become apparent from the following description with reference to the accompanying drawings. In the description and the accompanying drawings, specific implementations of the present application are specifically disclosed, and part of the implementations in which the principles of the embodiments of the present application may be employed are indicated. It should be understood that the present application is not limited to the described implementations. On the contrary, the embodiments of the present application include all modifications, variations, and equivalents falling within the scope of the appended claims.

In the embodiments of the present application, the terms "first," "second," etc. are used to distinguish different elements, but do not represent a spatial arrangement or temporal order etc. of these elements, and these elements should not be limited by these terms. The term "and/or" includes any one of and all combinations of one or more associated listed terms. The terms "comprise," "include," "have," etc. refer to the presence of described features, elements, components, or assemblies, but do not exclude the presence or addition of one or more other features, elements, components, or assemblies.

In the embodiments of the present application, the singular forms "a," "the," etc. include plural forms, and should be broadly construed as "a type of" or "a class of" rather than limited to the meaning of "one." Furthermore, the term "said" should be construed as including both the singular and plural forms, unless otherwise specified in the context. In addition, the term "according to" should be construed as "at least in part according to . . . ," and the term "based on" should be construed as "at least in part based on . . . ," unless otherwise specified in the context.

The features described and/or illustrated for one implementation may be used in one or more other implementations in the same or similar manner, combined with features in other implementations, or replace features in other implementations. The term "include/comprise" when used herein refers to the presence of features, integrated components, steps, or assemblies, but does not preclude the presence or addition of one or more other features, integrated components, steps, or assemblies.

A transmission apparatus of an MRI system is first described below.

Figure 1:
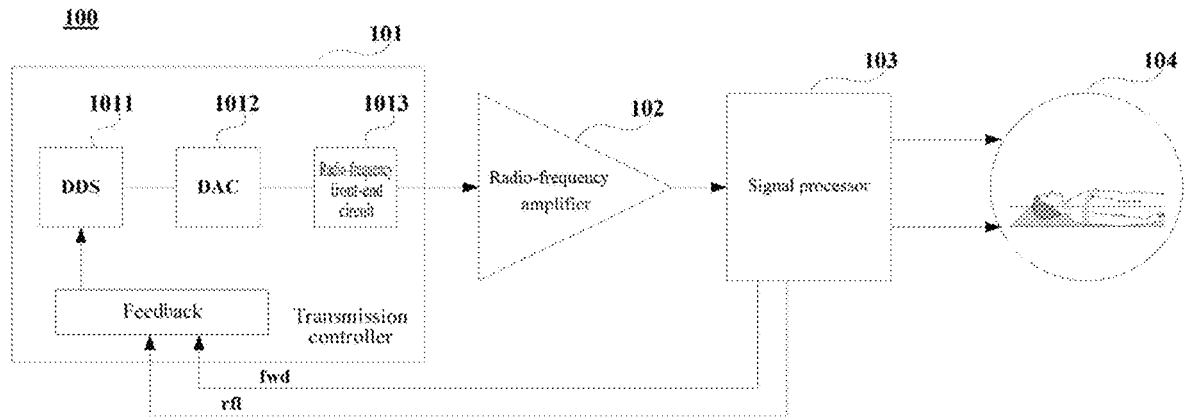
FIG. 1 is a schematic diagram of a transmission apparatus of a magnetic resonance imaging system.

FIG. 1 is a schematic diagram of a transmission apparatus of a magnetic resonance imaging system. As shown in FIG. 1, the apparatus 100 comprises: a transmission controller (which can also be referred to as a transmission control engine, a transmission control module/unit, etc.) 101 for generating and outputting a pulse signal; a radio-frequency amplifier (which can also be referred to as a radio-frequency module/unit, etc.) 102 for amplifying the pulse signal; and a signal processor (which can also be referred to as an output module/unit, etc.) 103 for transmitting, to a transmit coil 104 of the magnetic resonance imaging system, the signal amplified by the radio-frequency amplifier 102. Further, as shown in FIG. 1, the signal processor 103 can receive and adjust the phase of a feedback signal and output a phase-adjusted feedback signal to the transmission controller 101.

As shown in FIG. 1, the transmission controller 101 may include a direct digital frequency synthesizer (DDS) 1011, a digital-to-analog converter (DAC) 1012, and a radio-frequency front-end circuit 1013. The transmission controller 101 generates, according to an instruction or command, a scanning sequence (including a radio-frequency pulse signal) required during Mill scanning. The pulse signal can generate a radio-frequency field to excite a longitudinal magnetization vector of a scan subject to reverse, thereby generating a transverse magnetization vector. The transverse magnetization vector is helically attenuated around an outer magnetic field at a fixed angular frequency to produce a free induction decay signal. A magnetic resonance signal for imaging can be obtained according to the induction decay signal.

The transmission controller 101 typically generates a low-power radio-frequency pulse signal; and the transmission controller 101 is connected to the radio-frequency amplifier 102 to input the pulse signal into the radio-frequency amplifier 102. The type of the scanning sequence can be determined as desired, and the embodiments of the present application are not limited to thereto.

Optionally, the radio-frequency front-end circuit 1013 may further include a transmission attenuator not shown in the figure for controlling the extent to which the pulse signal is attenuated before being input to the radio-frequency amplifier 102. For specific implementations of the above transmission controller 101, reference can be made to the related art, and the present application is not limited thereto.

The radio-frequency amplifier 102 is used to receive the low-power radio-frequency pulse signal outputted by the transmission controller 101, perform amplification processing, and then output an amplified radio-frequency pulse signal. The radio-frequency amplifier 102 can process the received radio-frequency pulse signal to output a high-power radio-frequency pulse signal, thereby meeting imaging requirements of the magnetic resonance imaging system. For the structure and type of the radio-frequency amplifier 102, reference can be made to the related art, and examples are not enumerated herein.

The signal processor 103 transmits, to the transmit coil 104 of the magnetic resonance imaging system, the signal amplified by the radio-frequency amplifier 102, and outputs a feedback signal to the transmission controller 101. Optionally, the signal processor 103 may include a transmit/receive mode switch not shown in the figure. The transmit/receive mode switch is controlled by the pulse signal from the transmission controller 101, so as to electrically connect the radio-frequency amplifier 102 to the transmit coil of the magnetic resonance imaging system during a transmit mode. In addition, the signal processor 103 can also receive a part of reflected signals generated by the scan subject.

The signal processor 103 outputs a feedback signal to the transmission controller 101. The feedback signal includes a forward feedback signal (e.g., fwd in FIG. 1) and/or a reverse feedback signal (e.g., rfl in FIG. 1). The forward feedback signal is a signal directly outputted by the signal processor 103, namely, a feedback signal at a front end of the transmit coil. The reverse feedback signal is a signal returned from the transmit coil after the amplified radio-frequency pulse signal has reached the transmit coil, namely, a feedback signal at a rear end of the transmit coil.

The above is a schematic description of the transmission apparatus of the Mill system. However, the present application is not limited thereto. For example, each component may be adjusted appropriately, and some other components may be incorporated or some components may be eliminated. Those skilled in the art could make appropriate variations according to the above disclosure, rather than being limited by the disclosure of FIG. 1.

The inventors have found that currently, bandwidth data of various components of the transmission apparatus is configured separately, and even if an indicator of bandwidth data of each component is good, an indicator of bandwidth data of the entire transmission apparatus may be still poor, which greatly affects the performance of the transmission apparatus and reduces the quality of magnetic resonance images.

Further, subjects to be examined by the Mill system may vary, e.g., in terms of weight, height, size, etc., so the load of the Mill system varies greatly. The load difference of the Mill system can lead to a large bandwidth difference of the transmission apparatus, which affects the performance of the transmission apparatus and reduces the quality of magnetic resonance images.

For at least one of the above problems, the embodiments of the present application are specifically described below.

Embodiments of First Aspect

Figure 2:
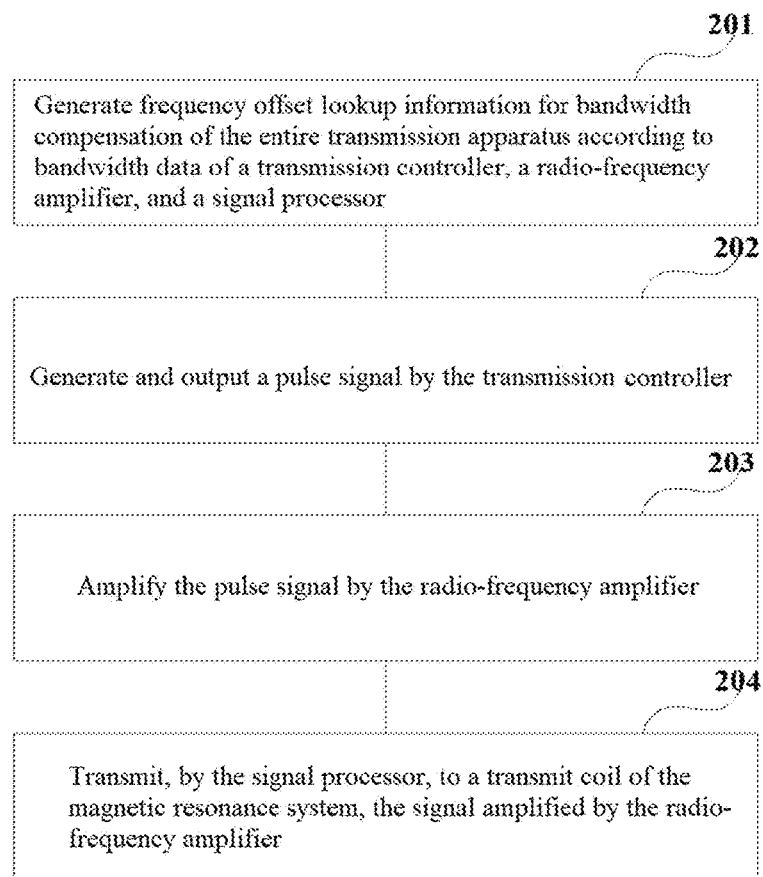
FIG. 2 is a schematic diagram of a transmission method of a magnetic resonance imaging system according to an embodiment of the present application.

Provided in an embodiment of the present application is a transmission method of a magnetic resonance imaging system. FIG. 2 is a schematic diagram of the transmission method of the magnetic resonance imaging system according to the embodiment of the present application. As shown in FIG. 2, the transmission method includes: at step 201, generating frequency offset lookup information for bandwidth compensation of the entire transmission apparatus according to bandwidth data of a transmission controller, a radio-frequency amplifier, and a signal processor; wherein the frequency offset lookup information is used to control the transmission controller to generate output power.

As shown in FIG. 2, the transmission method further includes: a) step 202, generating and outputting a pulse signal by the transmission controller; b) step 203, amplifying the pulse signal by the radio-frequency amplifier; and c) step 204, transmitting, by the signal processor, the signal amplified by the radio-frequency amplifier to a transmit coil of the magnetic resonance imaging system.

It should be noted that FIG. 2 merely schematically illustrates the embodiment of the present application, but the present application is not limited thereto. For example, the order of execution between operations may be suitably adjusted. In addition, some other operations may also be added or some of these operations may be omitted. Those skilled in the art could make appropriate variations according to the above disclosure, rather than being limited by the disclosure of FIG. 2.

Thus, the frequency offset lookup information for bandwidth compensation of the entire transmission apparatus is generated according to bandwidth data of the transmission controller, the radio-frequency amplifier, and the signal processor. The bandwidth performance of the entire transmission apparatus can be improved, and the quality of magnetic resonance images can be improved.

In some embodiments, the bandwidth data of the transmission controller, the radio-frequency amplifier, and the signal processor is pre-generated respectively according to a standard load, and the bandwidth data of the transmission controller, the radio-frequency amplifier, and the signal processor is pre-stored respectively in respective memories.

For example, the transmission controller, the radio-frequency amplifier, and the signal processor are provided by different suppliers respectively. The suppliers can pre-generate respective bandwidth data according to a standard load (e.g., 50 Ohm). For the specific content of bandwidth data, reference can be made to the related art. The suppliers can store the bandwidth data in the respective memories (e.g. EEPROMs) of the components, respectively.

In some embodiments, the bandwidth data of the transmission controller, the radio-frequency amplifier, and the signal processor is obtained from the memories of the transmission controller, the radio-frequency amplifier, and the signal processor, respectively, when the transmission controller, the radio-frequency amplifier, and the signal processor are integrated and initialized.

For example, a certain processing module in the transmission controller can read the bandwidth data from the EEPROMs of the components, and frequency offset lookup information, e.g., LUT (Look-Up Table) for bandwidth compensation of the entire transmission apparatus is generated according to these bandwidth data. The LUT can make multiple frequencies over a full bandwidth of the entire transmission apparatus correspond to different coefficients respectively, such that the performance of the entire transmission apparatus meets the requirements.

For example, the LUT is a two-dimensional table (of frequency and coefficient) where each frequency corresponds to a coefficient for bandwidth compensation, and the initial values of these coefficients can be set to default values. When the LUT is generated, after the transmission controller, the radio-frequency amplifier, and the signal processor are integrated and initialized, specific numeric values of the LUT can be adjusted with the goal of the entire transmission apparatus outputting a frequency response that is desirable (or that can meet the requirements), thereby obtaining the LUT corresponding to the desirable output characteristic. For the specific content of the LUT and how to generate the LUT, reference can also be made to the related art.

Figure 3:
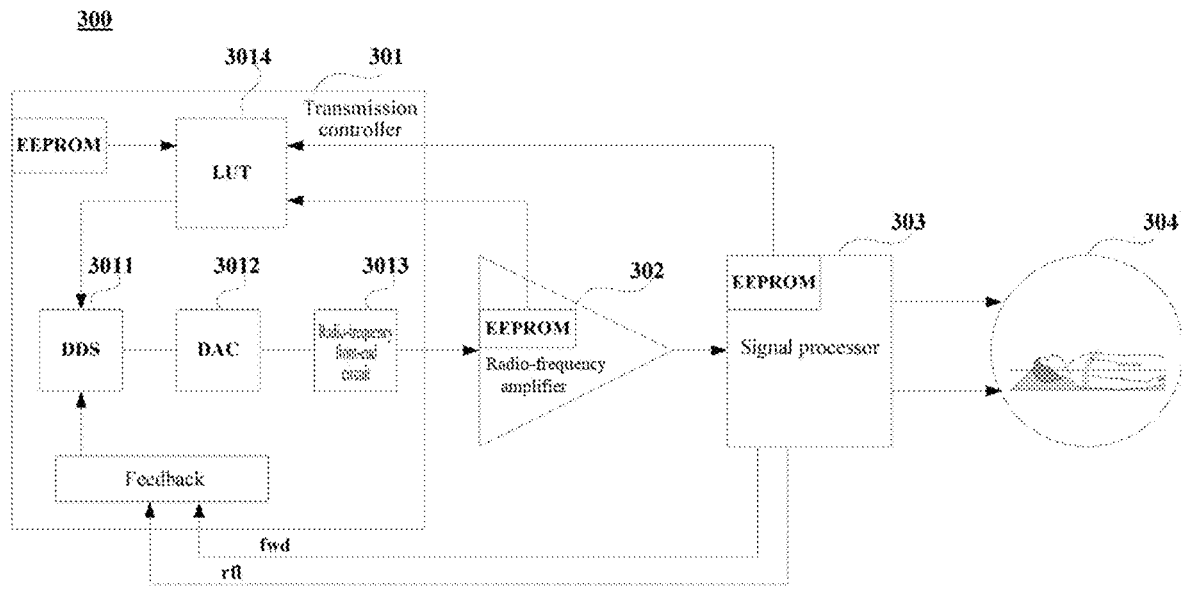
FIG. 3 is a schematic diagram of a transmission apparatus of a magnetic resonance imaging system according to an embodiment of the present application.

FIG. 3 is a schematic diagram of a transmission apparatus of a magnetic resonance imaging system according to an embodiment of the present application. As shown in FIG. 3, the transmission apparatus 300 comprises: a transmission controller 301 for generating and outputting a pulse signal; a radio-frequency amplifier 302 for amplifying the pulse signal; and a signal processor 303 for transmitting, to a transmit coil 304 of the magnetic resonance imaging system, the signal amplified by the radio-frequency amplifier 302. Further, as shown in FIG. 3, the signal processor 303 can receive and adjust the phase of a feedback signal and output a phase-adjusted feedback signal to the transmission controller 101.

As shown in FIG. 3, bandwidth data of the transmission controller 301, bandwidth data of the radio-frequency amplifier 302, and bandwidth data of the signal processor 303 can be read from an EEPROM of the transmission controller 301, an EEPROM of the radio-frequency amplifier 302, and an EEPROM of the signal processor 303, respectively, and an LUT 3014 for bandwidth compensation of the entire transmission apparatus 300 is generated according to this data. Certain components or modules (e.g., DDS 3011) in the transmission controller 301 can generate output power according to the LUT 3014.

Figure 4:
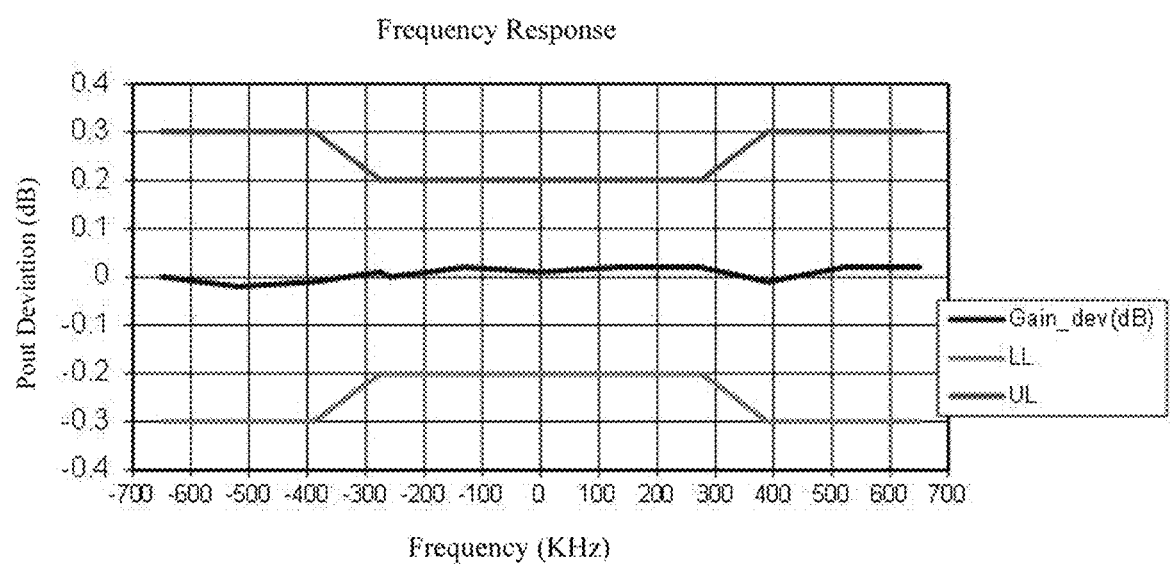
FIG. 4 is a schematic diagram of the relationship between frequency and deviation according to an embodiment of the present application.

FIG. 4 is a schematic diagram of the relationship between frequency and deviation according to an embodiment of the present application. As shown in FIG. 4, the entire transmission apparatus has good performance by using the frequency offset lookup information of the embodiment of the present application.

The above description is made with pre-storing the bandwidth data of the components as an example, but this application is not limited thereto. For example, the suppliers can also store the bandwidth data of the components on a medium (e.g., an optical disk or storage medium) separate from the component, or place the same on a particular server in the network, or communicate the same to an integrator by means of a communication tool, etc.

Further, the generation and update of the frequency offset lookup information can be implemented by the transmission controller (e.g., a module integrated in the transmission controller), or can also be implemented by other devices separate from the transmission controller. The frequency offset lookup information can be stored in the transmission controller, or can also be stored in other devices separate from the transmission controller. The memory can be an EEPROM or any other arbitrary storage medium.

The above is a schematic description of generation of the frequency offset lookup information, where an LUT is taken as an example, but the present application is not limited thereto, and the frequency offset lookup information can also be in other forms of data structure. By using this frequency offset lookup information, the overall performance of the components of the transmission apparatus after being integrated can be adjusted as a whole, and when an indicator of bandwidth data of each component is good, the entire transmission apparatus can have good performance.

In some embodiments, a plurality of training pulse signals modulated at different frequencies of a full bandwidth are generated for a particular load in a pre-scanning stage, and a first update is performed on the frequency offset lookup information according to the plurality of training pulse signals.

For example, for a certain subject to be examined (a particular load), an auto-prescan (APS) can be performed before formal scanning. The transmission controller can adjust the frequency offset for the entire operating bandwidth, e.g. from −650 KHz to +650 KHz. A TCE can generate multiple training pulse signals at these frequencies and capture forward power sampling to optimize the LUT for the particular load.

Figure 5:
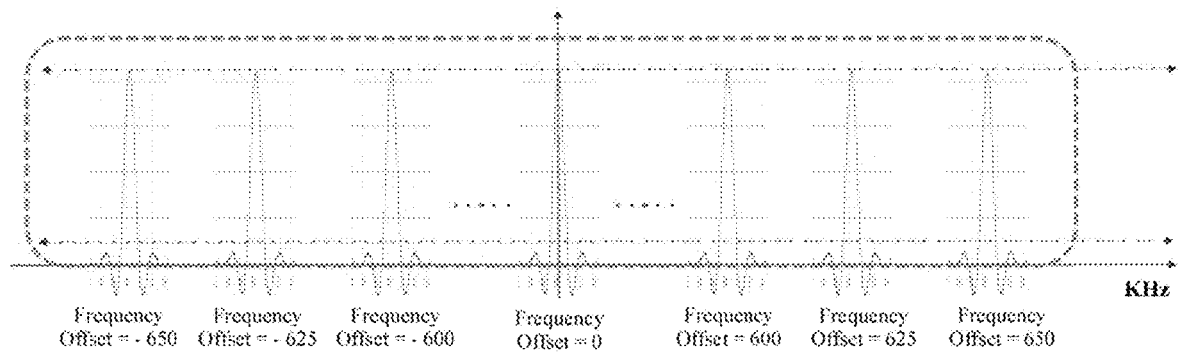
FIG. 5 is a schematic diagram of training pulse signals according to an embodiment of the present application.

FIG. 5 is a schematic diagram of training pulse signals according to an embodiment of the present application. As shown in FIG. 5, for example, a training pulse signal can be generated at a location of frequency offset equal to −650, −625, −600, . . . , 0, . . . 600, 625, 650. The frequency offset lookup information is updated according to these training pulse signals (which can be referred to as a dynamic update).

In some embodiments, the transmission controller (e.g., a direct digital frequency synthesizer therein) generates output power for the particular load in a scanning stage according to the frequency offset lookup information that has undergone the first update.

Thus, the frequency offset lookup information is updated for each particular load, which can eliminate or reduce the impact of the load difference on the bandwidth of the transmission apparatus, thereby further improving the performance of the transmission apparatus and improving the quality of magnetic resonance images.

In some embodiments, a second update is performed on the frequency offset lookup information according to a predetermined load or a load determined by machine learning.

For example, subjects to be examined in certain scenarios are relatively consistent and can be predetermined. For example, in Children's hospitals or pediatric departments, subjects to be examined can be classified easily, and thus several typical loads can be predetermined. For example, children aged 3-8 are classified as a first class of loads, children aged 9-12 are classified as a second class of loads, . . . , and so on. According to these predetermined loads, the frequency offset lookup information can be pre-updated (which can be referred to as a semi-static prior update).

As another example, subjects to be examined can be statistically calculated by machine learning. For example, various parameters of the MRI system at different loads are statistically calculated, so as to determine various typical loads. According to these loads determined by machine learning, the frequency offset lookup information can be updated (which can be referred to as a semi-static subsequent update).

In some embodiments, the transmission controller (e.g., a direct digital frequency synthesizer therein) generates output power for a particular load in a scanning stage according to the frequency offset lookup information that has undergone the second update.

Thus, the updated frequency offset lookup information can be used for a particular load, which can eliminate or reduce the impact of the load difference on the bandwidth of the transmission apparatus, thereby further improving the performance of the transmission apparatus and improving the quality of magnetic resonance images.

In some embodiments, it can be determined whether a particular load is the same as or similar to a predetermined load or a load determined by machine learning; if the two are the same or similar (e.g., the difference is less than or equal to a preset threshold, or the difference is within a preset range), the transmission controller (e.g., a direct digital frequency synthesizer therein) generates output power for the particular load in a scanning stage according to the frequency offset lookup information that has undergone the second update.

Thus, for a particular load, the updated frequency offset lookup information corresponding to a typical load that is the same as or similar to the particular load can be used, which can eliminate or reduce the impact of the load difference on the bandwidth of the transmission apparatus, thereby further improving the performance of the transmission apparatus and improving the quality of magnetic resonance images. In this case, the step of updating the frequency offset lookup information for each particular load in the pre-scanning stage can be skipped, which can improve the scanning efficiency while ensuring the scanning performance.

In some embodiments, it can be determined whether a particular load is the same as or similar to a predetermined load or a load determined by machine learning. If the two are not the same or similar (e.g., the difference is greater than a preset threshold, or the difference is outside of a preset range), a plurality of training pulse signals modulated at different frequencies of a full bandwidth are generated for a particular load in a pre-scanning stage, and a first update is performed on the frequency offset lookup information according to the plurality of training pulse signals; and the transmission controller (e.g., a direct digital frequency synthesizer therein) generates output power for the particular load in a scanning stage according to the frequency offset lookup information that has undergone the first update.

Thus, in the absence of the same or similar pre-stored load for a particular load, the frequency offset lookup information is then updated for that particular load, which can eliminate or reduce the impact of the load difference on the bandwidth of the transmission apparatus, thereby further improving the performance of the transmission apparatus and improving the quality of magnetic resonance images. In this case, the frequency offset lookup information is updated for an atypical load in a pre-scanning stage, which can further improve the scanning performance.

The above embodiments merely provide illustrative description of the embodiments of the present application. However, the present application is not limited thereto, and appropriate variations may be made on the basis of the above embodiments. For example, each of the above embodiments may be used independently, or one or more of the above embodiments may be combined.

It can be seen from the above embodiments that, frequency offset lookup information for bandwidth compensation of the entire transmission apparatus is generated according to bandwidth data of the transmission controller, the radio-frequency amplifier, and the signal processor. Thus, the method can use the frequency offset lookup information to perform digital pre-distortion processing of a power amplifier, and can also improve the bandwidth performance of the entire transmission apparatus and improve the quality of magnetic resonance images.

Further, dynamically or semi-statically updating the frequency offset lookup information can eliminate or reduce the impact of the load difference on the bandwidth of the transmission apparatus, thereby further improving the performance of the transmission apparatus and improving the quality of magnetic resonance images.

Embodiments of Second Aspect

Provided in an embodiment of the present application is a transmission apparatus of a magnetic resonance imaging system. The workflow and the like of the transmission apparatus have been described in the embodiments of the first aspect, and the same content as that of the embodiments of the first aspect is not repeated herein.

Figure 6:
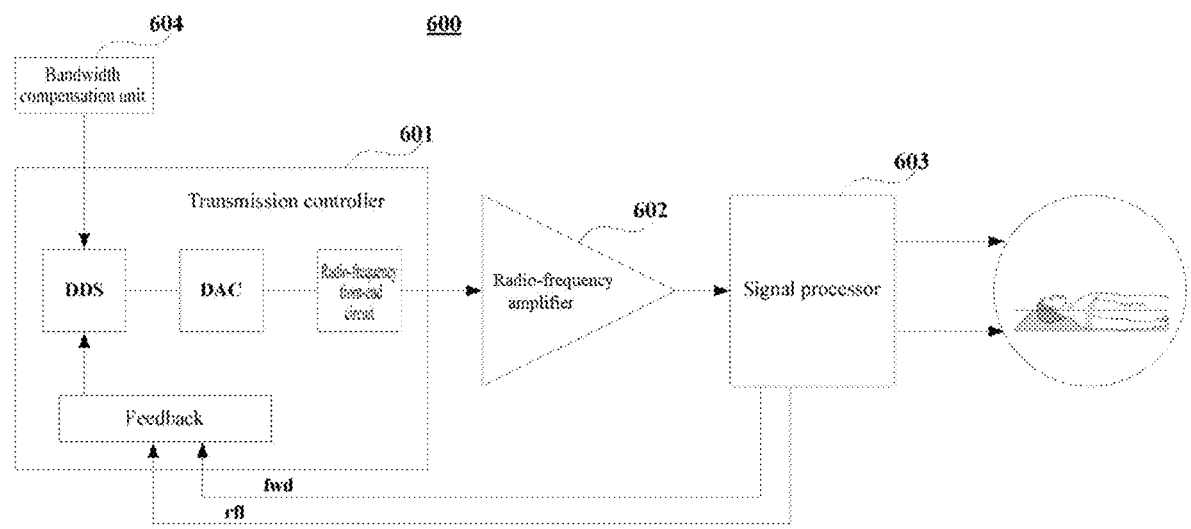
FIG. 6 is a schematic diagram of a transmission apparatus of a magnetic resonance imaging system according to an embodiment of the present application.

FIG. 6 is a schematic diagram of the transmission apparatus of the magnetic resonance imaging system according to the embodiment of the present application. As shown in FIG. 6, the transmission apparatus 600 of the magnetic resonance imaging system includes: a transmission controller 601 for generating and outputting a pulse signal; a radio-frequency amplifier 602 for amplifying the pulse signal; and a signal processor 603 for transmitting the signal amplified by the radio-frequency amplifier to a transmit coil of the magnetic resonance imaging system.

As shown in FIG. 6, the transmission apparatus 600 of the magnetic resonance imaging system further includes: a bandwidth compensation unit 604 for generating frequency offset lookup information for bandwidth compensation of the entire transmission apparatus according to bandwidth data of the transmission controller 601, the radio-frequency amplifier 602 and the signal processor 603; wherein the frequency offset lookup information is used to control the transmission controller 601 to generate output power.

FIG. 6 exemplarily shows that the transmission controller 601 includes a direct digital frequency synthesizer (DDS), a digital-to-analog converter (DAC), a radio-frequency front-end circuit, a feedback module, etc., but the present application is not limited thereto. For the specific structures of the transmission controller 601, the radio-frequency amplifier 602, the signal processor 603, reference can also be made to the related art.

In some embodiments, the bandwidth compensation unit 604 can be integrated in the transmission controller 601, e.g. as one module of the transmission controller 601, for example, as shown in FIG. 3; the bandwidth compensation unit 604 can also be provided separately from the transmission controller 601, e.g., as shown in FIG. 6. The embodiments of the present application are not limited thereto.

In some embodiments, the bandwidth data of the transmission controller 601, the radio-frequency amplifier 602, and the signal processor 603 is pre-generated respectively according to a standard load, and the bandwidth data of the transmission controller 601, the radio-frequency amplifier 602, and the signal processor 603 is pre-stored respectively in respective memories.

In some embodiments, the bandwidth compensation unit 604 obtains the bandwidth data of the transmission controller 601, the radio-frequency amplifier 602, and the signal processor 603 from the memories of the transmission controller 601, the radio-frequency amplifier 602, and the signal processor 603, respectively, when the transmission controller 601, the radio-frequency amplifier 602, and the signal processor 603 are integrated and initialized.

In some embodiments, the transmission controller 601 generates, for a particular load in a pre-scanning stage, a plurality of training pulse signals modulated at different frequencies of a full bandwidth, and the bandwidth compensation unit 604 further performs a first update on the frequency offset lookup information according to the plurality of training pulse signals.

The transmission controller 601 generates output power for the particular load in a scanning stage according to the frequency offset lookup information that has undergone the first update.

In some embodiments, the bandwidth compensation unit 604 further performs a second update on the frequency offset lookup information according to a predetermined load or a load determined by machine learning.

The transmission controller 601 generates output power for a particular load in a scanning stage according to the frequency offset lookup information that has undergone the second update.

In some embodiments, the transmission controller 601 also determines whether a particular load is the same as or similar to the predetermined load or the load determined by machine learning. If the two are the same or similar, the transmission controller 601 generates output power for the particular load in a scanning stage according to the frequency offset lookup information that has undergone the second update. If the two are not the same or similar, the transmission controller 601 generates, for the particular load in a pre-scanning stage, a plurality of training pulse signals modulated at different frequencies of a full bandwidth, and the bandwidth compensation unit 604 further performs a first update on the frequency offset lookup information according to the plurality of training pulse signals; and the transmission controller 601 generates output power for the particular load in a scanning stage according to the frequency offset lookup information that has undergone the first update.

For the sake of simplicity, FIG. 6 only exemplarily illustrates a connection relationship or signal direction between various components or modules, but it should be clear to those skilled in the art that various related technologies such as bus connection can be used. The various components or modules can be implemented by means of a hardware facility such as a processor, a memory, etc. The embodiments of the present application are not limited thereto.

The above embodiments merely provide illustrative description of the embodiments of the present application. However, the present application is not limited thereto, and appropriate variations may be made on the basis of the above embodiments. For example, each of the above embodiments may be used independently, or one or more of the above embodiments may be combined.

It can be seen from the above embodiments that, frequency offset lookup information for bandwidth compensation of the entire transmission apparatus is generated according to bandwidth data of the transmission controller, the radio-frequency amplifier, and the signal processor. Thus, the method can use the frequency offset lookup information to perform digital pre-distortion processing of a power amplifier, and can also improve the bandwidth performance of the entire transmission apparatus and improve the quality of magnetic resonance images.

Further, dynamically or semi-statically updating the frequency offset lookup information can eliminate or reduce the impact of the load difference on the bandwidth of the transmission apparatus, thereby further improving the performance of the transmission apparatus and improving the quality of magnetic resonance images.

Embodiments of Third Aspect

Further provided in an embodiment of the present application is a magnetic resonance imaging system.

Figure 7:
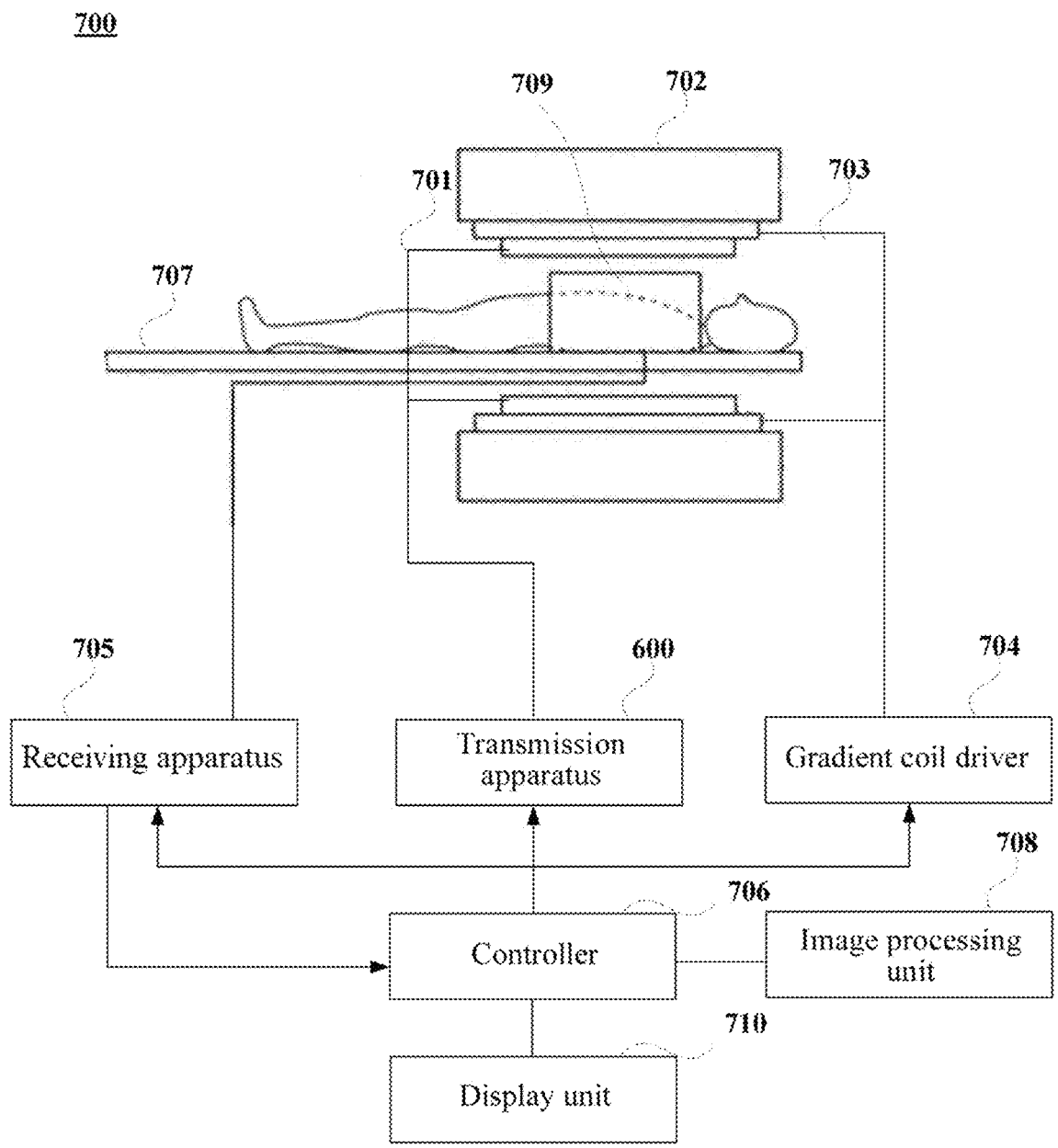
FIG. 7 is a schematic diagram of a magnetic resonance imaging system according to an embodiment of the present application.

FIG. 7 is a schematic diagram of the magnetic resonance imaging system according to the embodiment of the present application. As shown in FIG. 7, the magnetic resonance imaging system 700 includes a transmit coil 701 and the transmission apparatus 600 according to the embodiments of the second aspect, and can be used to configure scanning parameters before the MRI system performs pre-scanning or formal scanning. The same content as that of the embodiments of the first and second aspects is not repeated herein.

In some embodiments, the magnetic resonance imaging system may further include a main magnet assembly 702, a gradient coil assembly 703, a gradient coil driver 704, a receiving apparatus 705, a controller 506, a scanning table 707, an image processing unit 708, etc. For specific implementations, reference may be made to the related art, and the embodiments of the present application are not limited thereto.

In some embodiments, the main magnet assembly 702 generally includes, for example, a superconducting magnet. A main magnet coil is arranged along the circumference of the superconducting magnet. The superconducting magnet is installed in an annular vacuum container, and defines a cylindrical imaging space surrounding a scan subject. A constant static magnetic field, such as a static magnetic field B0, is generated in a Z direction of the imaging space. The MRI system uses the formed static magnetic field B0 to transmit a magnetostatic pulse signal to the subject accommodated in the imaging space, such that precession of protons in the body of the subject is ordered, and a longitudinal magnetization vector is generated.

In some embodiments, the transmit coil 701 is generally arranged along an inner ring of the main magnet, and emits, in response to an RF excitation pulse emitted from the transmission apparatus 600, a radio-frequency field B1 orthogonal to the static magnetic field B0 to the scan subject so as to excite nuclei in the body of the scan subject, such that the longitudinal magnetization vector is transformed into a transverse magnetization vector. For example, the controller 706 can instruct the transmission controller 601 to generate a scanning sequence, and generate an RF pulse signal. After being amplified by the radio-frequency amplifier 602, the signal is transmitted by the signal processor 603 to the RF transmit coil 701.

In some embodiments, after the end of a radio-frequency excitation pulse, a free induction decay signal, namely a magnetic resonance signal that can be acquired, is generated in the process in which the transverse magnetization vector of the scan subject is gradually restored to zero.

In some embodiments, the RF transmit coil 701 can be switched between a transmit mode and a receive mode by means of the transmit/receive mode switch in the signal processor 603. In the receive mode, the RF transmit coil 701 can be used to receive a magnetic resonance signal from the scan subject, and the magnetic resonance signal can also be acquired by means of an RF receive coil 709 (optional) disposed adjacent to the scan subject.

In some embodiments, the controller 706 provides a gradient waveform to the gradient coil driver 704. The gradient coil driver 704 includes GX, GY, and GZ amplifiers, etc. Each GX, GY, and GZ gradient amplifier excites a corresponding gradient coil in the gradient coil assembly 703 so as to generate a magnetic field gradient used to spatially encode an MR signal during MRI scanning.

In some embodiments, the receiving apparatus 705 is used to receive a magnetic resonance signal acquired by the receive coil 709 or the transmit coil 701 in the receive mode. The receiving apparatus 705 may include an RF preamplifier, a phase detector, an analog/digital conversion module, etc. For details, reference can be made to the related art. The RF preamplifier is used to amplify the received magnetic resonance signal. The phase detector is used to perform phase detection on the amplified magnetic resonance signal. The analog/digital conversion module is used to convert the magnetic resonance signal that has undergone the phase detection from an analog signal to a digital signal, and then send the same to the image processing unit 708.

In some embodiments, the image processing unit 708 can perform operations such as preprocessing, reconstruction, etc. on the received digitized magnetic resonance signal, so as to acquire a required image or image data. The image processing unit 708 may include a processor and a storage medium. A program for predetermined data processing to be performed by the processor is recorded on the storage medium. The image processing unit 708 can be connected to the controller 706, and perform data processing on the basis of a control signal received from the controller 706. Optionally, the image processing unit 708 can be a separate apparatus connected to the MRI system, or functions of the image processing unit 708 can be integrated into the controller 706. The embodiments of the present application are not limited thereto.

In some embodiments, the controller 706 may include a processor and a storage medium. The storage medium is used to store a program executable by the processor. When a computer executes the program, respective components of the MRI system can perform corresponding operations so as to implement a scanning process for the scan subject. The scanning process may include a pre-scan and a subsequent formal scan.

For example, the controller 706 can control the MRI system to perform pre-scanning according to a predetermined pulse sequence. This can involve, but is not limited to, controlling the amplitude, power, flip angle, frequency, etc. of an RF pulse signal emitted by the transmission apparatus 600, and can involve, but is not limited to, controlling the power of a driving signal sent by the gradient coil driver 704, the density of a magnetic resonance signal acquired by the receiving apparatus 705, etc.

Although it is described in the embodiments of the second aspect that the bandwidth compensation unit 604 can be a separate modular component, the bandwidth compensation unit 604 can also be disposed in the transmission controller 601, and the functions of the bandwidth compensation unit 604 can also be integrated into the transmission controller 601. The embodiments of the present application are not limited thereto. For example, the functions of the bandwidth compensation unit 604 may be integrated into the processor of the transmission controller 601. However, it can be understood that the functions of the bandwidth compensation unit 604 may also be implemented by means of the controller 706.

In some embodiments, the MRI system may further include a user input device (not shown), such as a keyboard and a mouse. An operator can input an operation signal with respect to the controller 706 by means of the user input device. For example, a user can send pre-configured scanning parameters, etc. to the controller 706 by means of the input device.

In some embodiments, the MRI system may further include a display unit 710. The display unit 710 can be connected to the input device to display an operation interface, and can also be connected to the image processing unit 708 to display an image. In addition, the storage media in the controller 706 and in the image processing unit 708 and the memory may include, for example, a ROM, a floppy disk, a hard disk, an optical disk, a magneto-optical disk, a CD-ROM, or a non-volatile memory card, and the like. The embodiments of the present application are not limited thereto. In addition, the magnetic resonance imaging system 700 may further include components not shown in FIG. 7, such as a physiological acquisition controller, a scan subject positioning apparatus, etc. For details, reference can be made to the related art, and examples are not enumerated herein.

The embodiments of the present application further provide a computer-readable program. When the program is executed in a transmission apparatus or an MM system, the program causes a computer to execute, in the transmission apparatus or the MRI system, the transmission method according to the embodiments of the first aspect.

The embodiments of the present application further provide a storage medium having a computer-readable program stored thereon. The computer-readable program causes a computer to execute, in a transmission apparatus or an MM system, the transmission method according to the embodiments of the first aspect.

The above device and method of the present application can be implemented by hardware, or can be implemented by hardware in combination with software. The present application relates to such a computer-readable program, when executed by a logical component, causes the logical component to implement the foregoing device or constituent part, or causes the logical component to implement various methods or steps as described above. The present application further relates to a storage medium for storing the above program, such as a hard disk, a magnetic disk, an optical disk, a DVD, a flash memory, etc.

The method/device described with reference to the embodiments of the present application may be directly embodied as hardware, a software module executed by a processor, or a combination of the two. For example, one or more of the functional block diagrams and/or one or more combinations of the functional block diagrams shown in the drawings may correspond to either respective software modules or respective hardware modules of a computer program flow. These software modules may respectively correspond to the steps shown in the figures. These hardware modules can be implemented, for example, by firming the software modules using a field-programmable gate array (FPGA).

The software modules may be located in a RAM, a flash memory, a ROM, an EPROM, an EEPROM, a register, a hard disk, a portable storage disk, a CD-ROM, or any storage medium in other forms known in the art. A storage medium may be coupled to a processor, so that the processor can read information from the storage medium and can write information into the storage medium. Alternatively, the storage medium may be a component of the processor. The processor and the storage medium may be located in an ASIC. The software module may be stored in a memory of a mobile terminal, and may also be stored in a memory card that can be inserted into a mobile terminal. For example, if an apparatus (such as a mobile terminal) uses a large-capacity MEGA-SIM card or a large-capacity flash memory device, the software modules can be stored in the MEGA-SIM card or the large-capacity flash memory device.

One or more of the functional blocks and/or one or more combinations of the functional blocks shown in the accompanying drawings may be implemented as a general-purpose processor, a digital signal processor (DSP), an application specific integrated circuit (ASIC), a field-programmable gate array (FPGA) or other programmable logic devices, discrete gate or transistor logic devices, a discrete hardware assembly, or any appropriate combination thereof for implementing the functions described in the present application. The one or more functional blocks and/or the one or more combinations of the functional blocks shown in the accompanying drawings may also be implemented as a combination of computing apparatuses, such as a combination of a DSP and a microprocessor, multiple microprocessors, one or more microprocessors in communication combination with a DSP, or any other such configuration.

The present application is described above with reference to specific implementations. However, it should be clear to those skilled in the art that such description is merely illustrative and is not intended to limit the scope of protection of the present application. Various variations and modifications could be made by those skilled in the art according to the principle of the present application, and these variations and modifications also fall within the scope of the present application.

The invention claimed is:

1. A transmission method of a magnetic resonance imaging system, the method comprising:
   generating and outputting a pulse signal by a transmission controller;
   amplifying the pulse signal by a radio-frequency amplifier;
   transmitting, by a signal processor, the pulse signal amplified by the radio-frequency amplifier to a transmit coil of the magnetic resonance imaging system;
   characterized by further comprising:
   generating frequency offset lookup information for bandwidth compensation of the entire transmission apparatus according to bandwidth data of the transmission controller, the radio-frequency amplifier, and the signal processor; wherein the frequency offset lookup information is used to control the transmission controller to generate output power; and
   wherein the method further comprises generating a magnetic resonance image using the amplified pulse signal transmitted to the transmit coil of the magnetic resonance imaging system.

2. The method according to claim 1, wherein the bandwidth data of the transmission controller, the radio-frequency amplifier, and the signal processor is pre-generated respectively according to a standard load, and the bandwidth data of the transmission controller, the radio-frequency amplifier, and the signal processor is pre-stored respectively in respective memories.

3. The method according to claim 2, further comprising:
   obtaining the bandwidth data of the transmission controller, the radio-frequency amplifier, and the signal processor from the memories of the transmission controller, the radio-frequency amplifier, and the signal processor, respectively, when the transmission controller, the radio-frequency amplifier, and the signal processor are integrated and initialized.

4. The method according to claim 1, further comprising:
generating, for a particular load in a pre-scanning stage, a plurality of training pulse signals modulated at different frequencies of a full bandwidth, and
performing a first update on the frequency offset lookup information according to the plurality of training pulse signals.

5. The method according to claim 4, further comprising:
generating output power for the particular load in a scanning stage by the transmission controller according to the frequency offset lookup information that has undergone the first update.

6. The method according to claim 1, further comprising:
performing a second update on the frequency offset lookup information according to a predetermined load or a load determined by machine learning.

7. The method according to claim 6, further comprising:
generating output power for a particular load in a scanning stage by the transmission controller according to the frequency offset lookup information that has undergone the second update.

8. The method according to claim 6, further comprising:
determining whether a particular load is the same as or similar to the predetermined load or the load determined by machine learning;
if the two are the same or similar, generating output power for the particular load in a scanning stage by the transmission controller according to the frequency offset lookup information that has undergone the second update.

9. The method according to claim 8, wherein, if the two are not the same or similar,
generating, for the particular load in a pre-scanning stage, a plurality of training pulse signals modulated at different frequencies of a full bandwidth, and performing a first update on the frequency offset lookup information according to the plurality of training pulse signals; and
generating output power for the particular load in a scanning stage by the transmission controller according to the frequency offset lookup information that has undergone the first update.

10. A magnetic resonance imaging system including a transmission apparatus, the transmission apparatus comprising:
a transmission controller for generating and outputting a pulse signal;
a radio-frequency amplifier for amplifying the pulse signal;
a signal processor for transmitting the pulse signal amplified by the radio-frequency amplifier to a transmit coil of the magnetic resonance imaging system;
characterized by further comprising:
a bandwidth compensation unit for generating frequency offset lookup information for bandwidth compensation of the entire transmission apparatus according to bandwidth data of the transmission controller, the radio-frequency amplifier, and the signal processor; wherein the frequency offset lookup information is used to control the transmission controller to generate output power; and
wherein the magnetic resonance imaging system generates a magnetic resonance image using the amplified pulse signal transmitted to the transmit coil of the magnetic resonance imaging system.

11. The apparatus according to claim 2, wherein the bandwidth data of the transmission controller, the radio-frequency amplifier, and the signal processor is pre-generated respectively according to a standard load, and the bandwidth data of the transmission controller, the radio-frequency amplifier, and the signal processor is pre-stored respectively in respective memories.

12. The apparatus according to claim 11, wherein the bandwidth compensation unit obtains the bandwidth data of the transmission controller, the radio-frequency amplifier, and the signal processor from the memories of the transmission controller, the radio-frequency amplifier, and the signal processor, respectively, when the transmission controller, the radio-frequency amplifier, and the signal processor are integrated and initialized.

13. The apparatus according to claim 2, wherein the transmission controller generates, for a particular load in a pre-scanning stage, a plurality of training pulse signals modulated at different frequencies of a full bandwidth, and the bandwidth compensation unit further performs a first update on the frequency offset lookup information according to the plurality of training pulse signals.

14. The apparatus according to claim 13, wherein the transmission controller generates output power for the particular load in a scanning stage according to the frequency offset lookup information that has undergone the first update.

15. The apparatus according to claim 10, wherein the bandwidth compensation unit further performs a second update on the frequency offset lookup information according to a predetermined load or a load determined by machine learning.

16. The apparatus according to claim 15, wherein the transmission controller generates output power for a particular load in a scanning stage according to the frequency offset lookup information that has undergone the second update.

17. The apparatus according to claim 15, wherein the transmission controller further determines whether a particular load is the same as or similar to the predetermined load or the load determined by machine learning;
if the two are the same or similar, the transmission controller generates output power for the particular load in a scanning stage according to the frequency offset lookup information that has undergone the second update.

18. The apparatus according to claim 17, wherein if the two are not the same or similar, the transmission controller generates, for the particular load in a pre-scanning stage, a plurality of training pulse signals modulated at different frequencies of a full bandwidth, and the bandwidth compensation unit further performs a first update on the frequency offset lookup information according to the plurality of training pulse signals; and the transmission controller generates output power for the particular load in a scanning stage according to the frequency offset lookup information that has undergone the first update.

19. A non-transitory storage medium having a computer-readable program stored therein, wherein the computer-readable program causes a computer to implement the transmission method according to claim 1 in a device.

* * * * *